United States Patent [19]

Mizuno et al.

[11] Patent Number: 5,225,382
[45] Date of Patent: Jul. 6, 1993

[54] TITANIUM OXIDE FILM

[75] Inventors: Atsushi Mizuno; Yasushi Fukui; Kazunari Nakamoto; Tsuguyasu Yoshii, all of Osaka, Japan

[73] Assignee: Nisshin Steel Co. Ltd, Tokyo, Japan

[21] Appl. No.: 858,456

[22] Filed: Mar. 27, 1992

[30] Foreign Application Priority Data

Apr. 3, 1991 [JP] Japan .................... 3-098283

[51] Int. Cl.$^5$ ............................. C04B 35/46
[52] U.S. Cl. .......................... 501/134; 501/1; 423/609; 423/610; 106/436
[58] Field of Search .................. 501/1, 134; 423/609, 423/610; 427/529, 564, 567; 106/436

[56] References Cited

U.S. PATENT DOCUMENTS 4,931,213 6/1990 Cass .................... 501/134 X

FOREIGN PATENT DOCUMENTS 363128166 5/1988 Japan .................... 427/529
63-161156 7/1988 Japan .
2270108 5/1992 Japan .

Primary Examiner—Karl Group
Attorney, Agent, or Firm—Nikaido, Marmelstein, Murray & Oram

[57] ABSTRACT

A titanium oxide film consists of a mixture of titanium monoxide (TiO), titanium dioxide (TiO$_2$), titanium trioxide (Ti$_2$O$_3$), titanium pentoxide (Ti$_3$O$_5$) and other titanium oxides which are expressed as Ti$_n$O$_{2n-1}$ is an integer from 4 to 10. Average content of oxygen in the film is from 51 to 59 atom percent.

1 Claim, 4 Drawing Sheets

TITANIUM OXIDE FILM

BACKGROUND OF THE INVENTION

The present invention relates to a titanium oxide film having a blue color, which is formed on a surface of a metallic material used for metallic ornament such as a watch band, frames of eyeglasses and accessories, and ornaments for indoor use, so as to provide a blue exterior.

In order to impart blue metallic luster on a surface of the metallic material, a transparent oxide thin film which causes a blue interference color is formed on the surface thereof. The transparent oxide thin film is formed by ion plating, sputtering, chemical coloring process, sol-gel process, and others.

The blue produced by the interference color varies with the thickness of the film. In order to obtain a constant tone, the film must have a constant thickness. However, it is difficult to form such a thin film by the conventional method while precisely controlling the thickness thereof. In addition, the film is apt to assume other colors unless the film is precisely and evenly distributed. As a result, the tone of the film slightly varies at every production lot.

Moreover, the color varies in accordance with an angle at which the coated surface is seen. Namely, the surface may assume blue when viewed only from one direction, the front, for example, and assume another color when viewed from another direction.

Japanese Patent Application Laid-Open 63-161156 discloses another method of imparting blue to a metal surface. In accordance with the method, a mixture thin film which contains a mixture of titanium oxides such as titanium monoxide (TiO) and titanium trioxide ($Ti_2O_3$) is precipitated by ion plating to form a blue thin film. Although the thickness of the film may not be precisely controlled, the surface assumes a uniform color. However, the obtained color is dark and lacks vividness.

The inventors of the present invention have made various researches on the mixture film and found that the type of the titanium oxides and the oxygen content in the film are important factors in determining the color of the film. The inventors filed Japanese Patent Application 2-270108 relating to a mixture film where average oxygen content therein is from 52 to 59 atom percent and the film comprises a mixture of titanium monoxide (TiO), titanium dioxide ($TiO_2$) and other titanium oxides which are expressed as $Ti_nO_{2n-1}$ where n is an integer larger than 2. Neither the thickness of the film nor the viewing angle at which the film is viewed affects the color of the blue film.

SUMMARY OF THE INVENTION

An object of the present invention is to provide an improved titanium oxide mixture film which assumes brighter blue.

According to the present invention, there is provided a titanium oxide film as a blue coating for a metal piece comprising a mixture of titanium monoxide (TiO), titanium dioxide ($TiO_2$), titanium trioxide ($Ti_2O_3$), titanium pentoxide ($Ti_3O_5$) and other titanium oxides which are expressed as $Ti_nO_{2n-1}$ where n is an integer from 4 to 10, and the average oxygen content of the film is from 51 to 59 atom percent.

The blue of the film is caused not by an interference color, but by the titanium oxides. Thus, the film assumes the same color although the thickness of the film may be uneven, or the viewing angle at which the surface of the film is viewed may change. The color of the mixed titanium oxide mixture film of the present invention is luminous and brighter than that of a conventional titanium oxide film. When the oxygen content is less than 51 atom percent, the tone of the blue darkens. If the oxygen content is more than 59 atom percent, the blue has low color saturation to be whitened. The blue thin film is formed by vacuum deposition of titanium while controlling the pressure of the ambient atmosphere.

The other objects and features of this invention will become understood from the following description with reference to the accompanying drawings.

DETAILED DESCRIPTION OF THE PREFERRED EMBODIMENT

Figure 1:
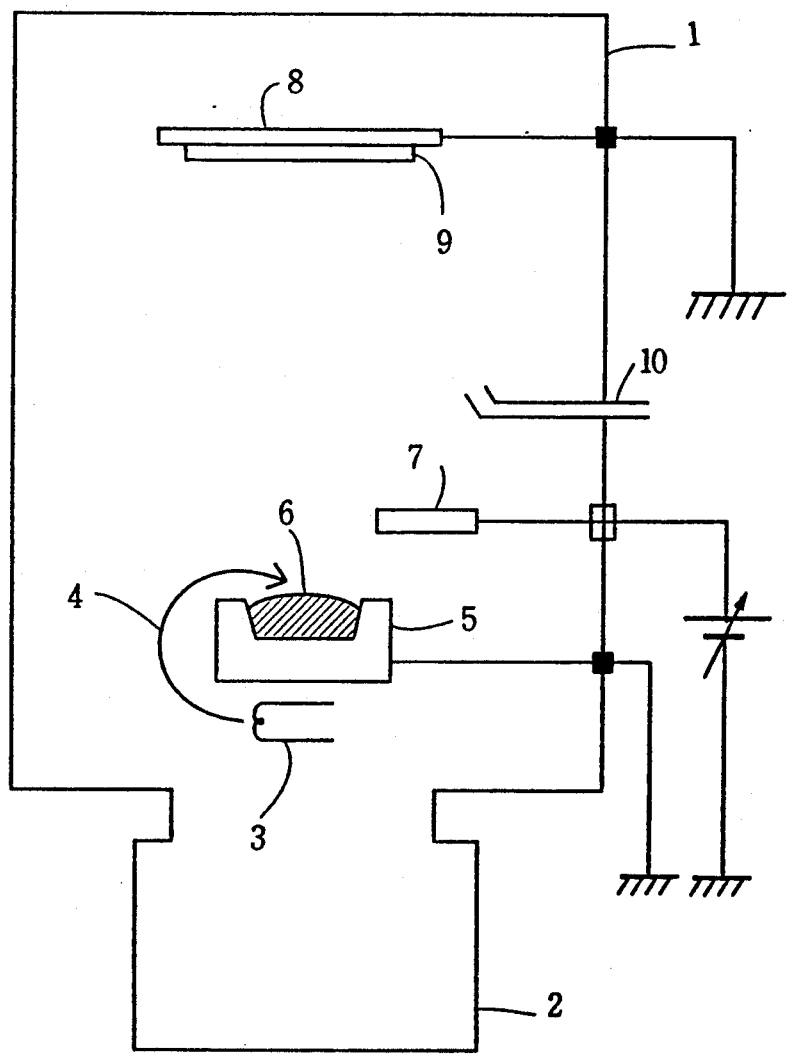
FIG. 1 shows schematic diagram of a device for ionizing and vacuum-depositing titanium for forming a blue titanium oxide mixture thin film of the present invention.

Referring to FIG. 1, a device for forming a titanium oxide mixture film on a metal plate 9 comprises a vacuum chamber 1 provided with a vacuum pump 2 mounted at a bottom portion of the vacuum chamber 1 for discharging air in the chamber. A holder 8 having a heater is mounted in an upper portion of the chamber 1 for supporting the plate 9. A crucible 5 wherein a lump of titanium 6 as an ion source is disposed is positioned in a lower portion of the chamber 1. Provided under the crucible 5 is an electron gun 3, and above the crucible 5 is an ionization electrode 7. A gas induction nozzle 10 is attached on a wall of the chamber 10 to supply oxygen.

The operation of the device is described. The metal plate 9, for example, a SUS 304 stainless steel plate, which measures 100 mm by 100 mm by 0.5 mm thickness, is mounted on the holder 8. The vacuum pump 2 is driven to reduce the pressure in the chamber 1 to $2.0 \times 10^{-5}$ Torr, and the plate 9 is heated by the heater of the holder 8 to 400° C. An electron beam 4 produced by the electron gun 3 melts and vaporizes the titanium 6 in the crucible 5. When the electrode 7 is energized with 50 V, an arc discharge is developed between the titanium 6 and the electrode 7, thereby ionizing the titanium vapor.

Oxygen is introduced into the chamber 1 through the nozzle 10 while maintaining the pressure therein at $2.0 \times 10^{-5}$ Torr. The oxygen reacts with the ionized titanium vapor so that various titanium oxides are formed in the chamber. The oxides are deposited on the surface of the plate 9, thereby forming a titanium oxide mixture film of 2 μm.

Figure 2:
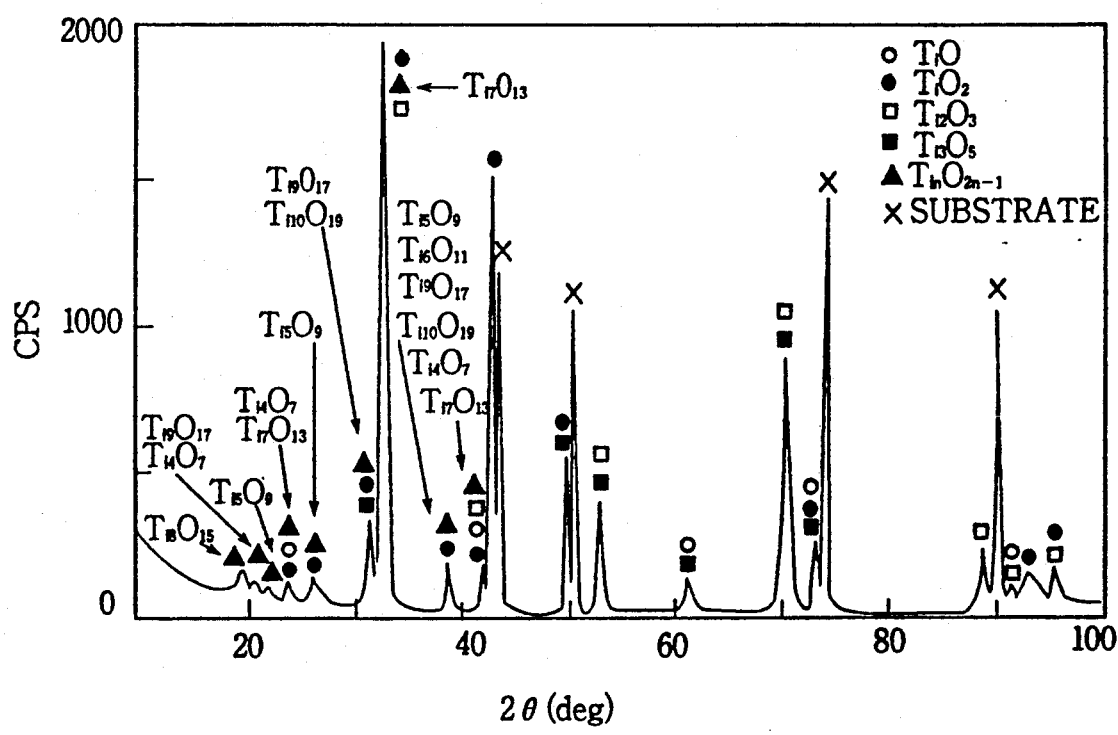
FIG. 2 is a graph showing an X-ray diffraction pattern of the blue titanium oxide mixture film.

The content of oxygen in the film which was measured by Auger electron spectroscopy was 55 atom percent. As shown by the X-ray diffraction pattern in FIG. 2, the titanium oxide film formed on the plate 9 comprised titanium monoxide (TiO), titanium dioxide ($TiO_2$), titanium trioxide ($Ti_2O_3$), titanium pentoxide ($Ti_3O_5$) and other titanium oxides expressed as $Ti_nO_{2n-1}$ where n is an integer between 4 and 10.

Figure 3:
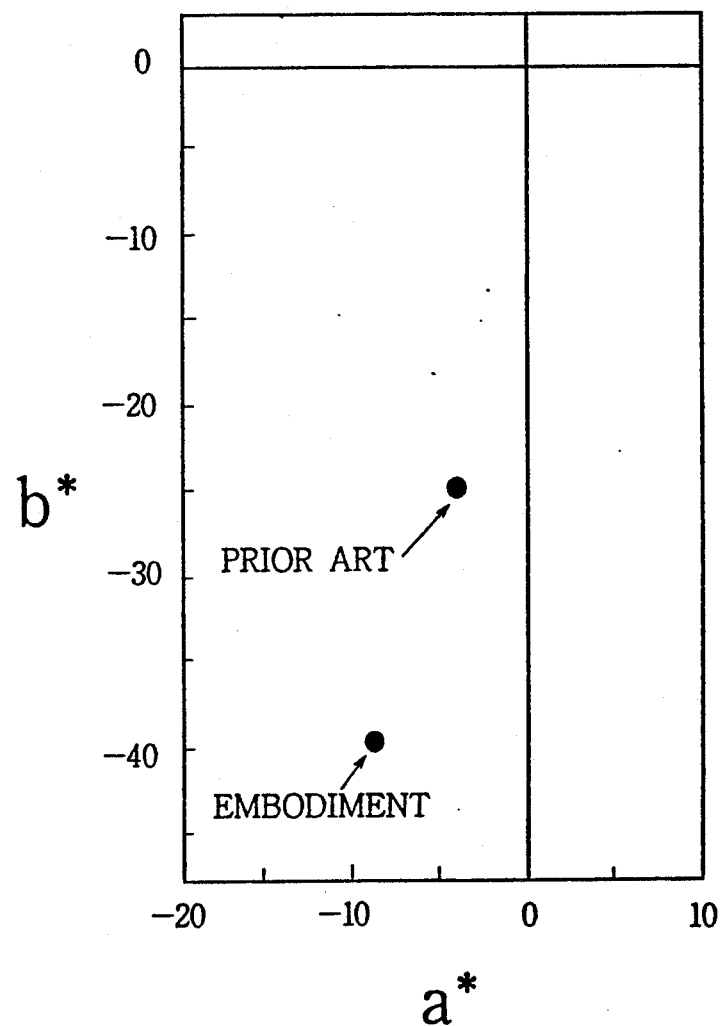
FIG. 3 is a graph showing tones of the blue titanium oxide films of the present invention and of the prior art, respectively.
Figure 4:
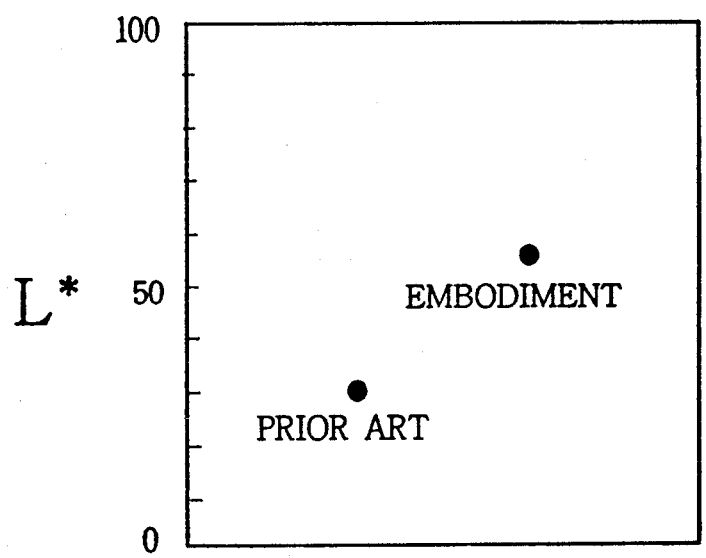
FIG. 4 is a graph showing lightness of the blue titanium oxide films of the present invention and of the prior art, respectively.

FIGS. 3 and 4 respectively show the tone and the lightness of the titanium oxide film thus formed, indicated by the CIELAB system of color representation where the standard source C is used. Referring to FIG. 3, an increase in positive direction along the a*-axis represents increase of red and increase in negative direction represent increase of green. An increase in positive direction along the b*-axis represents an increase of yellow and an increase in negative direction represents an increase of blue. The origin indicates an achromatic color. As shown in the graph, whereas the color of a conventional titanium oxide film falls on a point about $-25$ on the b*-axis, the color of the film of the present invention is about $-40$. Namely, the blue of the present film is more chromatic, so that more vivid blue film is obtained.

Referring to FIG. 4, the ordinate L* indicates lightness. The lightness of the blue of the film according to the present invention is extremely increased to about 55 from that of the conventional film, which is about 30.

From the foregoing, it will be understood that the present invention provides a thin mixture film comprising a mixture of various titaminum oxides as a blue coating for metal pieces. The color of the film is vivid and bright so that an ornament having a refined appearance can be provided.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A titanium oxide film composition consisting of a mixture of titanium monoxide (TiO), titanium dioxide ($TiO_2$), titanium trioxide ($Ti_2O_3$), titanium pentoxide ($Ti_3O_5$) and other titanium oxides which are expressed as $Ti_nO_{2n-1}$ where n is an integer from 4 to 10, and arrange content of oxygen in the film being from 51 to 59 atom percent.

* * * * *